US008375799B2

(12) United States Patent
Bradley et al.

(10) Patent No.: US 8,375,799 B2
(45) Date of Patent: Feb. 19, 2013

(54) INCREASED SENSOR DIE ADHESION

(75) Inventors: Alistair David Bradley, Hilliard, OH (US); Lamar Floyd Ricks, Lewis Center, OH (US); Richard Alan Davis, Plano, TX (US)

(73) Assignee: Honeywell International Inc., Morristown, NJ (US)

( * ) Notice: Subject to any disclaimer, the term of this patent is extended or adjusted under 35 U.S.C. 154(b) by 130 days.

(21) Appl. No.: 12/965,469

(22) Filed: Dec. 10, 2010

(65) Prior Publication Data

US 2012/0144921 A1   Jun. 14, 2012

(51) Int. Cl.
*G01L 9/06* (2006.01)

(52) U.S. Cl. .................. 73/727; 73/715; 73/721

(58) Field of Classification Search .................. None
See application file for complete search history.

(56) References Cited

U.S. PATENT DOCUMENTS

| 5,126,813 | A | | 6/1992 | Takahashi et al. |
| 5,225,373 | A | | 7/1993 | Takahashi et al. |
| 6,150,681 | A | * | 11/2000 | Allen ............................ 257/254 |
| 6,401,542 | B1 | * | 6/2002 | Kato ................................ 73/721 |
| 6,543,292 | B1 | * | 4/2003 | Colton et al. .................... 73/723 |
| 6,945,120 | B1 | * | 9/2005 | Marcus et al. ................... 73/756 |
| 7,073,375 | B2 | | 7/2006 | Parker et al. |
| 7,197,939 | B2 | * | 4/2007 | Sakai et al. ..................... 73/754 |
| 7,287,433 | B2 | * | 10/2007 | Tanaka ............................. 73/727 |
| 7,320,250 | B2 | * | 1/2008 | Ueno ................................ 73/754 |
| 7,377,177 | B1 | * | 5/2008 | Lamb et al. ..................... 73/756 |
| 7,425,052 | B2 | | 9/2008 | Silverbrook |
| 7,578,194 | B1 | | 8/2009 | Hadjiloucas et al. |
| 7,930,944 | B2 | * | 4/2011 | Machir et al. ................... 73/756 |
| 7,994,618 | B2 | * | 8/2011 | Dehe et al. ..................... 257/684 |
| 2006/0179953 | A1 | | 8/2006 | Ueno |
| 2008/0222884 | A1 | | 9/2008 | Bradley et al. |
| 2010/0055821 | A1 | | 3/2010 | Buhler et al. |
| 2010/0230766 | A1 | | 9/2010 | Elian et al. |
| 2010/0242628 | A1 | | 9/2010 | Knobloch et al. |
| 2010/0271735 | A1 | | 10/2010 | Schreiber |

FOREIGN PATENT DOCUMENTS

| EP | 1700894 A2 | 9/2006 |
| JP | 03065627 A * | 3/1991 |

OTHER PUBLICATIONS

Search Report for Application No. 11192482.5-1236 Dated Mar. 5, 2012.

* cited by examiner

*Primary Examiner* — Lisa Caputo
*Assistant Examiner* — Jermaine Jenkins
(74) *Attorney, Agent, or Firm* — Seager Tufte & Wickhem LLC (57) ABSTRACT

Methods and devices for adhesively bonding a sensor die to a substrate are described. In some cases, a sensor assembly may include a pressure sensor die mounted to a substrate with an adhesive. The pressure sensor die may be fabricated to include a back-side having one or more adhesion features (e.g. recesses or indentations), which increase the surface area of the pressure sensor die that is in contact with the adhesive, to thereby increase the adhesion force therebetween. In some cases, the one or more adhesion features may define a non-planar interface between the pressure sensor die and the adhesive which, in some instances, may reduce the formation and/or propagation of cracks in the adhesive, which also may help increase the adhesion force therebetween.

22 Claims, 6 Drawing Sheets

INCREASED SENSOR DIE ADHESION

FIELD

The present disclosure relates generally to sensors, and more particularly, to methods and structures for adhering a sensor die to a substrate.

BACKGROUND

Sensors, such as pressure, flow and temperature sensors, are often used to sense the pressure, flow and/or temperature of a media (e.g. gas or liquid) in a fluid channel. Such sensors are used in a wide variety of applications including, for example, medical applications, flight control applications, industrial process applications, combustion control applications, weather monitoring applications, water metering applications, as well as many other applications. In many cases, such sensors include a sensor die that is secured to a substrate of some kind. In many instances, separation of the sensor die from the substrate can cause sensor degradation and/or failure.

SUMMARY

The present disclosure relates generally to sensors, and more particularly, to methods and structures for adhering a sensor die to a substrate. In one illustrative embodiment, a pressure sensor assembly is used as an example, and includes a pressure sensor die mounted to a substrate with an adhesive. The pressure sensor die may be fabricated to include a side having one or more adhesion features (e.g. recesses, indentations, protrusions, etc.) that increase the surface area of the pressure sensor die that comes into contact with the adhesive, which may increase the adhesion force therebetween. In some cases, the one or more adhesion features may define a non-planar interface between the pressure sensor die and the adhesive which, in some instances, may help reduce the formation and/or propagation of cracks in the adhesive.

In some instances, the one or more adhesion features may be formed along a periphery of the back-side of the pressure sensor die and/or may extend through a corresponding side surface of the pressure sensor die, but this is not required. In some cases, the corners of the back-side of the pressure sensor die may remain free of the one or more adhesion features. In some instances, the adhesive, which may be applied in one or multiple layers, may be applied to at least partially fill the one or more adhesion features formed in the side of the pressure sensor die and/or cover the one or more adhesion features.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION

The disclosure may be more completely understood in consideration of the following detailed description of various illustrative embodiments of the disclosure in connection with the accompanying drawings, in which.

DESCRIPTION

The following description should be read with reference to the drawings wherein like reference numerals indicate like elements throughout the several views. The description and drawings show several embodiments which are meant to be illustrative in nature.

Figure 1:
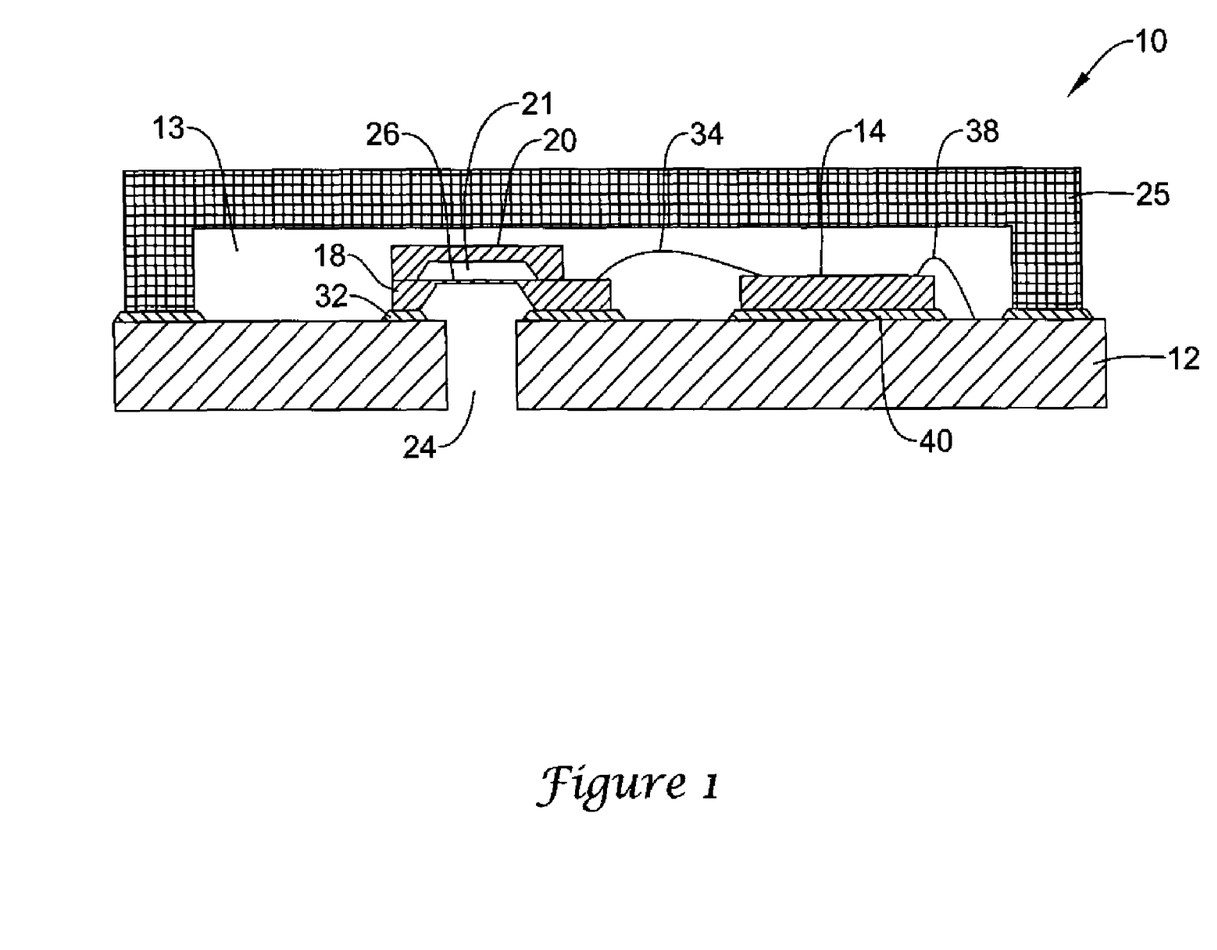
FIG. 1 is a cross-sectional view of an illustrative embodiment of a pressure sensor assembly.

FIG. 1 is a cross-sectional view of an illustrative pressure sensor assembly 10. As shown in FIG. 1, the pressure sensor assembly 10 includes a pressure sensor die 18 mounted on a package substrate 12 using an adhesive 32. In the illustrative embodiment, the pressure sensor die 18 may be a micromechanical sensor element fabricated using a silicon wafer and suitable fabrication techniques. The pressure sensor die 18 may have one or more pressure sensing elements and/or other circuitry (e.g. trim circuitry, signal conditioning circuitry, etc.) formed using suitable fabrication or printing techniques. In some cases, the pressure sensor die 18 may include a pressure sensitive diaphragm 26, including one or more pressure sensing elements such as piezoresistive components formed thereon, for sensing a pressure differential between a top and bottom side of the pressure sensor die 18. In some instances, the pressure sensing diaphragm 26 may be fabricated by back-side etching a silicon die 18, however, it is contemplated that any suitable process may be used, as desired. In the illustrative embodiment, the piezoresistve components may be configured to have an electrical resistance that varies according to an applied mechanical pressure or stress applied to the pressure sensitive diaphragm 26 (e.g. pressure sensing diaphragm 26 deflection). In some cases, the piezoresistive components may include a silicon piezoresistive material, however, other non-silicon materials may be used if desired. In some cases, the piezoresistive components may be connected in a Wheatstone bridge configuration (full or half bridge). It is to be understood, however, that such piezoresistive sensing elements are only one example of a pressure sensing element that can be used, and it is contemplated that any suitable sensing elements may be used including, for example, capacitive, electromagnetic, piezoelectric, or other types of sensing elements, as desired.

In the illustrative embodiment, pressure sensor assembly 10 is shown as an absolute pressure sensor having an internal vacuum reference pressure cavity 21. In this example, the internal vacuum reference pressure cavity 21 may be defined by a pressure sensor cap 20 that is mounted over the pressure sensing diaphragm 26 of the pressure sensor die 18. As shown, the pressure sensor cap 20 may define cavity 21 enclosing the internal vacuum reference pressure. However, this is just one example, and it is contemplated that in other instances, the pressure sensor assembly 10 may be a differential pressure sensor, a vacuum pressure sensor, a gauge pressure sensor, and/or any other suitable pressure sensor, as desired. A differential pressure sensor may reference two pressures, and a gauge pressure sensing element may reference atmospheric pressure or the like.

In the illustrative embodiment shown in FIG. 1, the pressure sensor die 18 may be configured to sense a pressure differential between a top side and a bottom side of the pressure sensing diaphragm 26. In some instances, the package substrate 12 may include an opening 24 to expose the bottom side of the pressure sensing diaphragm 26 to the bottom side of the package substrate 12. The pressure sensor die 18 may be mounted over the opening 24 of the package substrate 12. The opening 24 may be sized to expose the back side of the pressure sensing diaphragm 26 to the bottom side of the package substrate 12. In this instance, a pressure applied to a fluid (liquid or gas) adjacent the back side of pressure sensor assembly 10 may be transmitted to the back side of pressure sensing diaphragm 26 via opening 24. In some cases, a pressure on the top side of the pressure sensor die 18 may be the internal vacuum reference pressure defined in cavity 21. In the illustrative embodiment, a pressure difference across the pressure sensing diaphragm 26 causes the pressure sensing diaphragm 26 to deflect, stressing the piezoresistive elements and causing the resistance of the piezoresistive diaphragm 26 to change. Applying a current through the piezoresistive diaphragm 26 then provides a signal corresponding to the pressure difference across the pressure sensing diaphragm 26.

In some embodiments, the pressure sensor assembly 10 may include optional signal conditioning circuitry 14 mounted to the package substrate 12, sometimes using an adhesive 40. As shown, signal conditioning circuitry 14 may be secured to the package substrate 12 adjacent to the pressure sensor die 18, and may be in communication with the pressure sensor die 18 via direct die-to-die wire bonds, but this is not required. As shown in FIG. 1, pressure sensor die 18 may be connected to signal conditioning circuitry 36 via wire bond(s) 34, and signal conditioning circuitry 14 may be connected to trace conductors on the package substrate 12 via wires 38. Trace conductors may be connected to connectors, leads or terminals (not shown) of the pressure sensor assembly 10.

When so provided, the optional signal conditioning circuitry 14 may receive a signal from the pressure sensor die 18 via wire bond(s) 34, and condition and/or process the signal (s) for transmission from the pressure sensor assembly 10. In some cases, the signal received by the optional signal conditioning circuitry 14 may be an unconditioned signal (e.g. raw signal) corresponding to the pressure sensed by the pressure sensing element (e.g. pressure sensing diaphragm 26). In some instances, the optional signal conditioning circuitry 14 may be provided on a separate die or other electronics module. In some cases, the separate die may include a microprocessor, a microcontroller, and/or an ASIC (Application Specific Integrated Circuit). In some cases, it is contemplated that the signal conditioning circuitry 14 may be fabricated on the same die as the pressure sensing element, if desired. The signal conditioning circuitry 14 may include amplification, analog-to-digital conversion, offset compensation circuitry, and/or any other suitable conditioning circuitry, as desired. When so provided, the signal conditioning circuitry 14 may receive a signal from the pressure sensor die 18 and condition and/or process the signal, which can then be transmitted from the pressure sensor assembly 10. In some instances, optional signal conditioning circuitry 14 may not be provided, and the pressure sensor die 18 may provide raw signals that are transmitted from the pressure sensor assembly 10.

In the illustrative embodiment, the package substrate 12 may include a ceramic material, however, other suitable material may be used as desired. In some cases, the pressure sensor die 18 may be mounted to the substrate 12 using an adhesive 32, such as a silicone, epoxy, or acrylic based die attach adhesive, and/or any other suitable adhesive. One example epoxy is a high tensile epoxy. A solder may also be considered an adhesive. As shown in FIG. 1, pressure sensor die 18 may be directly attached or glued to the package substrate 12 using adhesive 32 with no intervening isolation layers or substrates. However, in other instances, it is contemplated that an intervening isolation layer(s) or glass substrate may be provided, if desired.

In the illustrative embodiment, the pressure sensor assembly 10 may include a top protective cover 25 and, in some cases, a bottom protective cover (not shown). As illustrated, the top protective cover 25 is disposed on a top side (upper side in FIG. 1) of the package substrate 12 to help protect the pressure sensor die 18 and to define a cavity 13 for the pressure sensor die 18 and optional signal conditioning circuitry 14. If provided, the bottom protective cover can be disposed on a bottom side (lower side in FIG. 1) of the package substrate 12. With such a configuration, the top and/or bottom protective covers 25 may help protect the pressure sensing element, signal conditioning circuitry, and any other provided circuitry and/or components, as desired. In some cases, the top protective cover 25 and the bottom protective cover may be formed from, for example, plastic, polyamide, ceramic, or another suitable material. In some instances, these covers may be attached to the substrate with the same "footprint" on each side, but this is not required.

Although not shown, the pressure sensor assembly 10 may include one or more external electrical leads or terminals mounted to the substrate 12 that are electrically connected to the signal conditioning circuitry 14 (if provided) for receiving one or more signals corresponding to the pressure sensed by the pressure sensor die 18. In some cases, the one or more external electrical leads or terminals may include metal, however, any suitable material may be used, as desired, such as conductive polymers.

In the illustrative embodiment, a maximum burst pressure of the pressure sensor assembly 10 may be set according to the adhesive bond between the pressure sensor die 18 and the substrate 12. In one example, when a pressure is applied to the back-side (lower side in FIG. 1) of the pressure sensing diaphragm 26 of the pressure sensor die 18 via opening 24, the pressure exerts a force pushing the pressure sensor die 18 away from substrate 12. If this pressure force is greater than the adhesive (and/or cohesive) force between the pressure sensor die 18 and substrate 12, the pressure sensor die 18 may separate from the substrate 12 and the pressure sensor assembly 10 may leak and/or fail.

Figure 2:
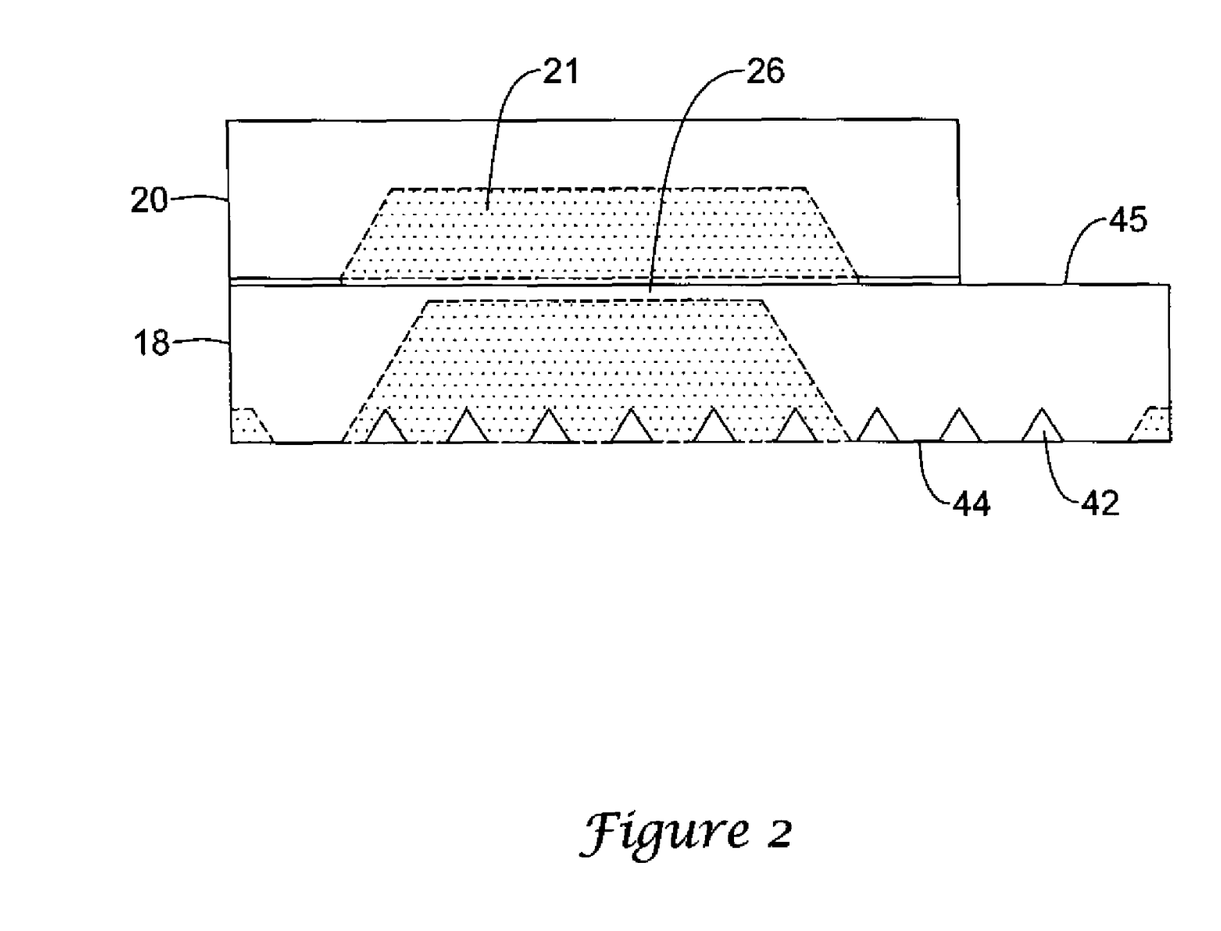
FIG. 2 is a side view of the illustrative pressure sensor die of FIG. 1.
Figure 3:
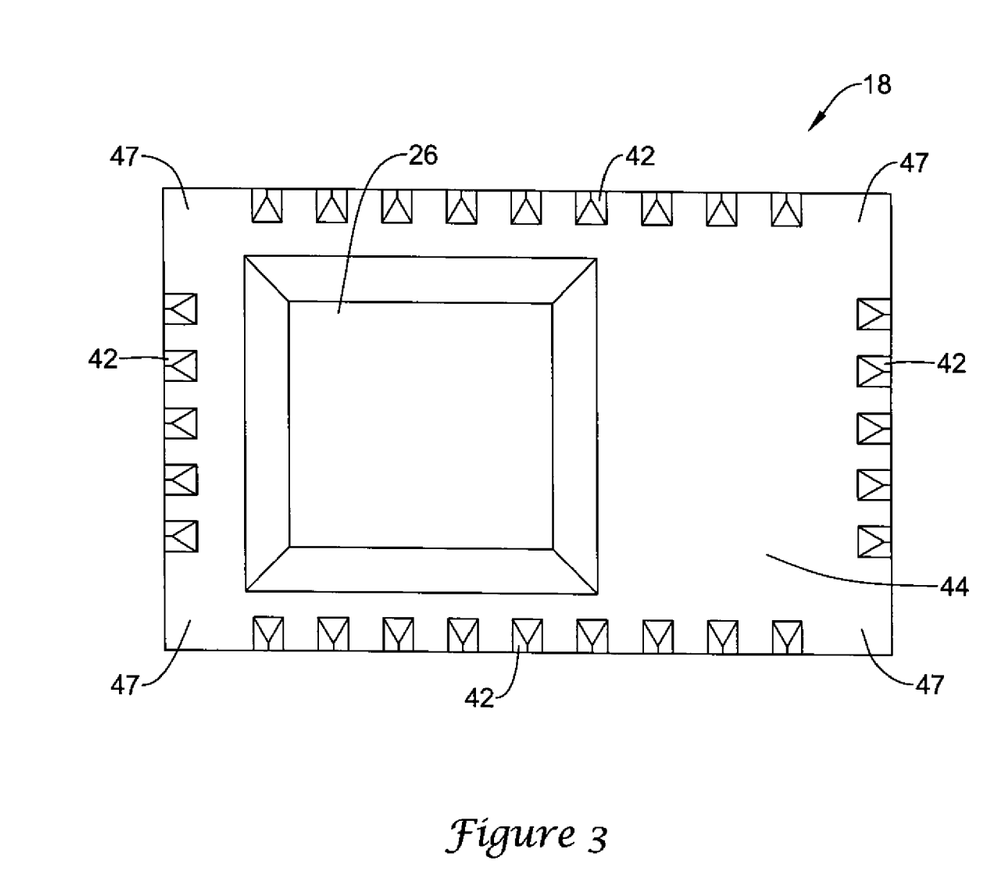
FIG. 3 is a bottom view of the illustrative pressure sensor die of FIG. 1.

As shown in FIGS. 2 and 3, which are side and bottom views of the illustrative pressure sensor die 18 of FIG. 1, respectively, the pressure sensor die 18 may include one or more adhesion features 42 for improving the adhesive joint (e.g. increasing the adhesive force) between the adhesive 32 and the pressure sensor die 18. The one or more adhesion feature 42 may be formed in the back-side 44 of the pressure sensor die 18 to increase the surface area of the pressure sensor die 18 in contact with the adhesive 32, thereby increasing the adhesive force between the pressure sensor die 18 and adhesive 32. In some cases, the one or more adhesion features 42 may define a non-planar interface between the pressure sensor die 18 and the adhesive 32 which, in some instances, may help reduce the formation and/or propagation of cracks in the adhesive (which may also increase the cohesive force of the adhesive). In some cases, the one or more adhesion features 42 increasing the surface area of the pressure sensor die 18 may also increase the cohesive force of the adhesive 32.

In the illustrative embodiment of FIG. 1-3, the one or more adhesion features 42 may include one or more notches, grooves, indentations, recesses, or other structures formed in the back-side 44 of the pressure sensor die 18. In some cases, the one or more adhesion features 42 may be fabricated by wet etching using, for example, a chemical etchant such as, for example, potassium hydroxide (KOH). For example, when used with a (100) silicon wafer and a suitable masking layer, spaced adhesion features 42 may be formed in the back-side 44 of the pressure sensor die 18, and each may have a sloping side wall at an angle of, for example, approximately 55 degrees. In this illustrative example, the one or more adhesion features 42 may be etched into the backside 44 of the silicon wafer in the same processing step that is used to form the diaphragm 26. In some cases, the sloping side wall may help assist in reducing the amount of gas that may become otherwise trapped in the one or more adhesion feature 42 during placement of the die, outgassing, and/or curing of the adhesive. Gas trapped in the one or more adhesion features 42 may, in some cases, reduce the adhesive force between the pressure sensor die 18 and adhesive 32 as the gas may reduce the surface area of the back-side of the pressure sensor die 18 that is in contact with the adhesive 32.

While chemical etching is one suitable technique for forming the adhesion features 42, it is contemplated that the adhesion features 42 may be fabricated using other fabrication techniques, such as, for example, plasma etching (e.g. deep reactive ion etch (DRIE)), other chemical etchants (e.g. isotropic etchants with Hydrofluoric and Nitric Acid), mechanical abrasion including micro-abrasion, and/or any other suitable fabrication technique, as desired.

In some embodiments, the adhesion features 42 may be fabricated in the same processing step(s) that defines the pressure sensing diaphragm 26 (e.g. masking, etching), but this is not required. For example, the back-side 44 of a wafer used to manufacture the pressure sensor die 18 may be covered with a masking layer defining both the pressure sensing diaphragm 26 and the one or more adhesion features 42. Then, the wafer may be etched (e.g. wet or dry etching) to define both the pressure sensing diaphragm 26 and adhesion features 42. The masking layer can then be removed from the wafer. This is just one example, and it is contemplated that the pressure sensing diaphragm 26 and one or more adhesion features 42 may be formed using separate processing steps and/or using different fabrication techniques, as desired.

Alternatively, or in addition, it is also contemplated that the one or more adhesion features 42 may be formed in the top-side of the substrate 12 to help improve the adhesive joint (e.g. increasing the adhesive force) between the adhesive 32 and the substrate 12. When one or more adhesion features 42 are provided in both the back-side of the pressure sensor die 18 and the top-side of the substrate 12, it is contemplated that the adhesion features in the top-side of the substrate 12 may be formed in a pattern that is complementary to the pattern of adhesion features in the back-side of the pressure sensor die 18, such that the adhesive layer has a more uniform thickness between the pressure sensor die 18 and the top-side of the substrate 12 than if no adhesion features were provided in the top-side of the substrate 12.

As shown in FIG. 3, it is contemplated that the one or more adhesion features 42 may be positioned around a perimeter of the back-side 44 of the pressure sensor die 18. In some cases, the one or more adhesion features 42 may extend through a corresponding side surface (side surface facing left, up, right and/or down in FIG. 3) of the pressure sensor die 18. Extending the one or more adhesion features 42 through a corresponding side surface may, in some cases, help prevent gas from becoming trapped between the pressure sensor die 18 and the adhesive 32.

In some instances, one or more of the corners 47 of the back-side 44 may remain flat (e.g. unetched) or, in other words, may remain free of the one or more adhesion features 42, but this is not required. In some cases, having the corners 47 of the back-side 44 free of adhesion features 42 may aid in removing the pressure sensor die 18 from a wafer tape using push-pins during fabrication of the pressure sensor assembly 10. However, it is contemplated that corners 47 may include one or more adhesion features 42, if desired.

In the illustrative embodiment, the one or more adhesion features 42 may be configured to have any desired width, depth, shape, and spacing. In the example shown in FIGS. 2 and 3, the one or more adhesion features 42 have generally sloped sidewalls having an angle of about 55 degrees. However, it is contemplated that other angles or no slope may be provided, as desired. Also, for example, FIG. 3 shows nine adhesion features 42 formed in the back-side 44 along the top and bottom edges of the pressure sensor die 18, and five adhesion features 42 along the left and right edges. It is contemplated, however, that two or more, three or more, four or more, five or more, six or more, seven or more, eight or more, nine or more, ten or more, or any other number of adhesion features 42 may be provided adjacent any edge (or elsewhere) of the pressure sensor die 18, as desired.

In the illustrative embodiment, the adhesion features 42 may be fabricated to have any desired depth according to the etching time and/or process used. For example, the one or more adhesion features may be fabricated to have a depth of about one-fifth of the thickness of the pressure sensor die 18, about one-fourth of the thickness of the pressure sensor die 18, about one-third of the thickness of the pressure sensor die 18, about one-half of the thickness of the pressure sensor die 18, about two-thirds of the thickness of the pressure sensor die 18, or any other depth or combination of depths, as desired.

In one illustrative example, a pressure sensor die 18 may be about 2 millimeters in length by about 2 millimeters in width, and have a thickness of about 0.4 millimeters. In this example, the adhesion features 42 may have a depth of about 0.14 millimeters (e.g. less than one-half the thickness), a width of about 0.2 millimeters, and may be spaced about 0.2 millimeters apart. This is just one example and it is contemplated that other width, depth, spacing, and number of adhesion features 42 may be used, as desired.

In some embodiment, the one or more adhesion features 42 may be utilized in conjunction with other features to help increase the adhesive force between the pressure sensor die 18 and the substrate 12. For example, it is contemplated that the back-side 44 of the pressure sensor die 18 may have a surface roughness, which may be provided by micro-abrasion or a chemical etchant.

While the one or more adhesion features 42 are shown in the back-side 44 of the pressure sensor die 18 in FIGS. 2 and 3, it is contemplated that the one or more adhesion features 42 may be provided on other surface of the pressure sensor die 18, as desired. For example, it is contemplated that the one or more adhesion features 42 may be provided on a front side 45 of the pressure sensor die 18 or any suitable surface that is configured to be mounted to a substrate or other surface (e.g. pressure sensor cap 20), as desired.

Figure 4:
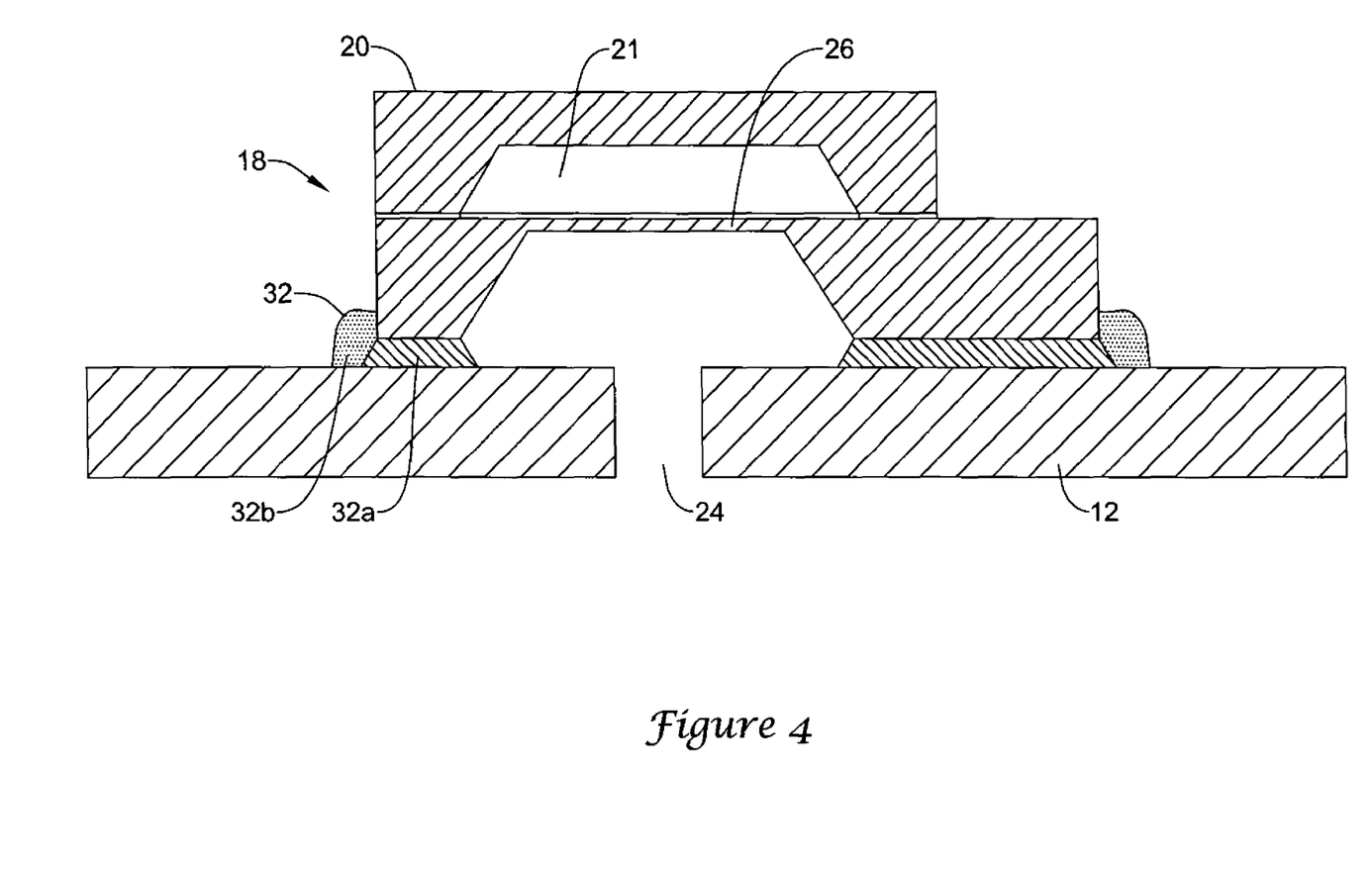
FIG. 4 is a cross-sectional view of the illustrative pressure sensor die of FIGS. 2 and 3 shown mounted to the substrate with an adhesive.

FIG. 4 is a cross-sectional view of the illustrative pressure sensor die 18 of FIGS. 2 and 3, mounted to the substrate 12. As shown, pressure sensor die 18 is bonded to the substrate 12 with adhesive 32, which may be a silicone, epoxy, or acrylic based die attach adhesive, and/or any other suitable adhesive. One example adhesive that may be used is a high tensile adhesive. In some cases, multiple layers of adhesive 32 may be applied. For example, a first layer 32a of adhesive may be provided between the substrate 12 and the back-side 44 of pressure sensor die 18. A second layer or application of adhesive, such as adhesive layer 32b, may be applied around the edges of the pressure sensor die 18. In some cases, the second adhesive layer 32b may be applied after the pressure sensor die 18 is mounted to the substrate 12. In some instances, the second adhesive layer 32b may be applied to completely cover the adhesion features 42 extending through the side walls of the pressure sensor die 18, but this is not required. In other instances, the second adhesive layer 32b may only partially cover the adhesion features 42, when provided through the side walls of the pressure sensor die 18.

Figure 5:
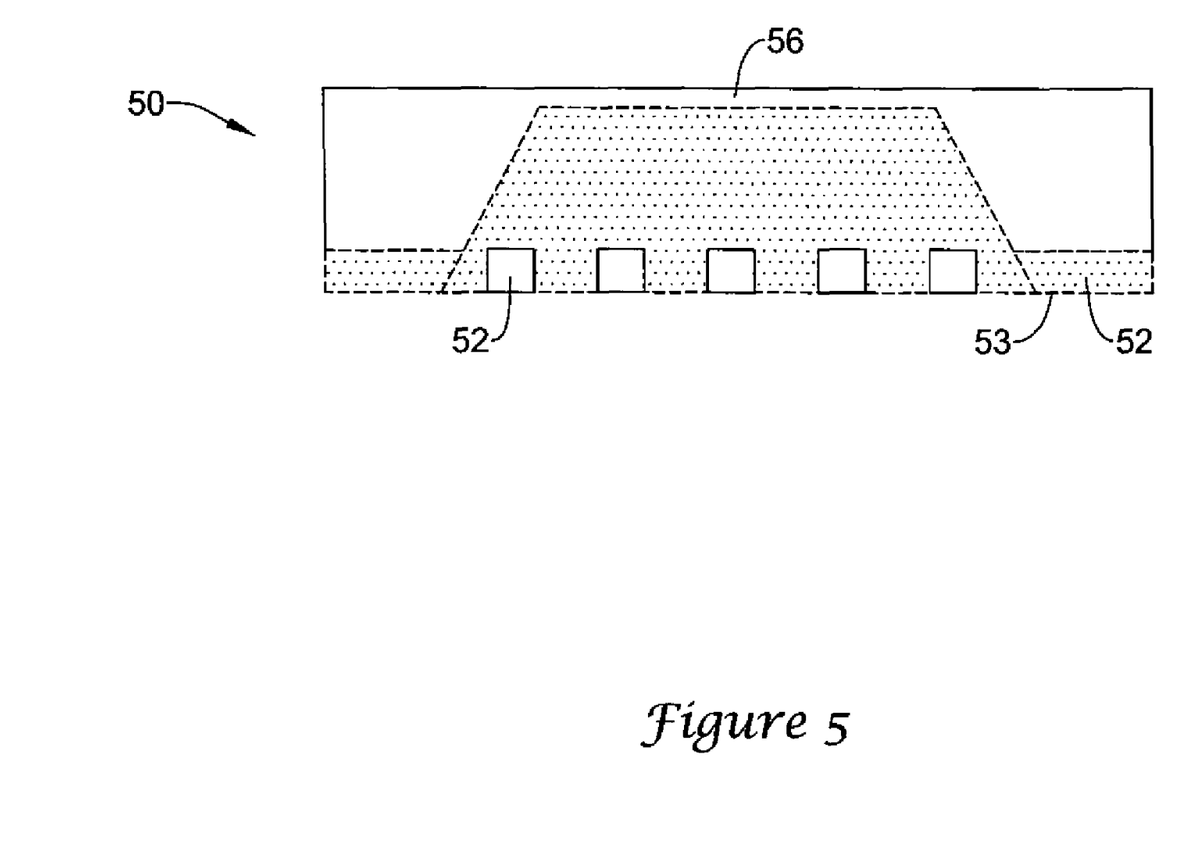
FIG. 5 is a side view of another illustrative pressure sensor die.
Figure 6:
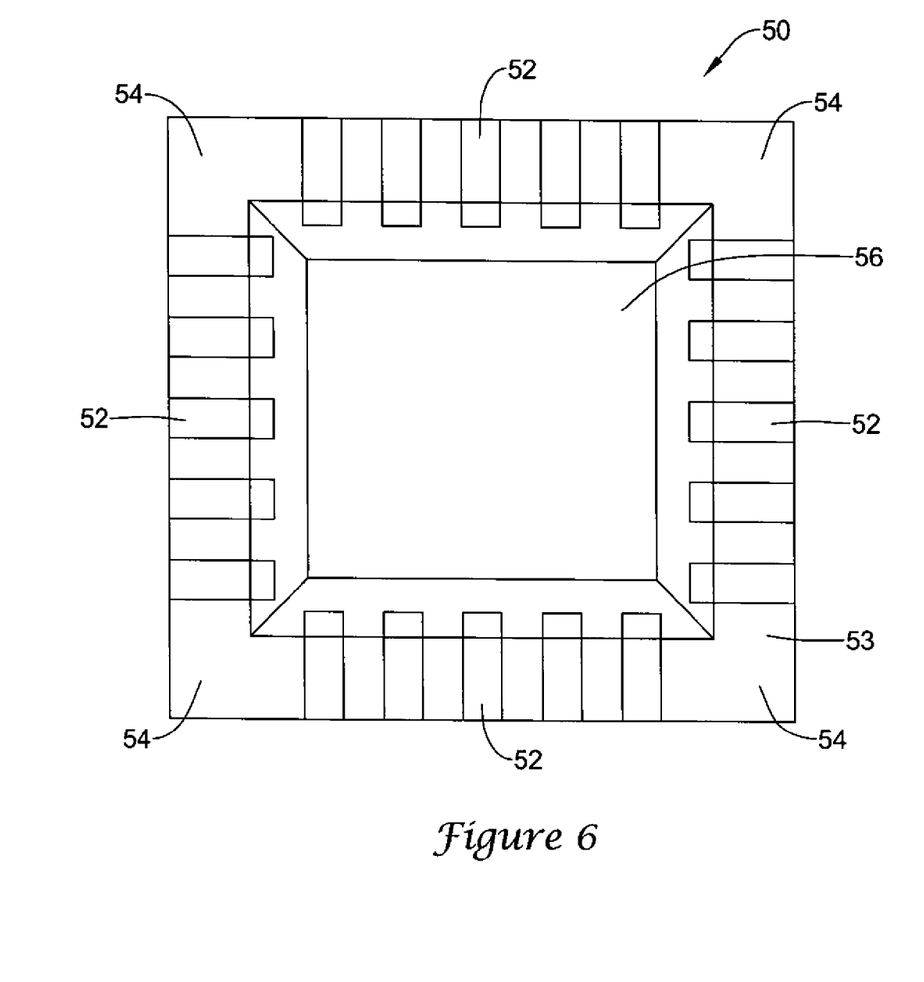
FIG. 6 is a bottom view of the illustrative pressure sensor die of FIG. 5.

FIGS. 5 and 6 are side and bottom views, respectively, of another illustrative pressure sensor die 50. In this illustrative embodiment, the pressure sensor die 50 is shown as a differential pressure sensor or a gauge pressure sensor. However, it is contemplated that the pressure sensor die 50 may be an absolute pressure sensor, if desired. As shown, the pressure sensor die 50 may include a pressure sensing diaphragm 56 and one or more sensing elements (e.g. piezoresistive elements, not shown) similar to pressure sensor die 18 shown in FIG. 1-4.

In the illustrative embodiment, pressure sensor die 50 may be fabricated to include one or more adhesion features 52, increasing the surface area of the back-side 53 of the pressure sensor die 50 to thereby increase the adhesion force between the back-side 53 and an adhesive. As shown, the one or more adhesion features 52 may be generally rectangular shaped. In some instances, the generally rectangular shaped adhesion features 52 may be formed using a plasma etch (e.g. DRIE) or a KOH etch on a (110) silicon wafer. However, these are just some examples, and it is contemplated that other suitable fabrication techniques may be used to form the generally rectangular shaped adhesion features, or any other shaped adhesion features, as desired.

As shown in FIGS. 5 and 6, there are five adhesion features 52 adjacent each of the edges of the pressure sensor die 50. However, it is contemplated that any number of adhesion features 52 may be used, as desired. Also, as shown in FIG. 5, the one or more adhesion features 52 may extend through corresponding side walls of the pressure sensor die 50, but this is not required.

While the foregoing has been described with reference to pressure sensors, it is contemplated that other or different types of sensors may be used, particularly when it may be desirable to provide increased adhesion between a sensor die and a substrate, such as flow sensors, humidity sensors, temperature sensors, position sensors, force sensors, load sensors, and/or or any other suitable sensor, as desired. It is contemplated that the pressure sensor die 18 shown in the foregoing Figures may be replaced or supplemented with a different type of sensor die, as desired.

Having thus described certain illustrative embodiments, those of skill in the art will readily appreciate that yet other embodiments may be made and used within the scope of the claims hereto attached. Changes may be made in details, particularly in matters of shape, size, and arrangement of parts without exceeding the scope of the disclosure.

What is claimed is:

1. A pressure sensor assembly, comprising:
    a pressure sensor die including:
        a front side;
        a back side;
        a pressure sensing diaphragm; and
        one or more adhesion features formed in the back side of the pressure sensor die, wherein the one or more adhesion features increases the surface area of the back side;
    a substrate having a top side and a bottom side, the substrate defining a pressure opening, wherein the pressure sensor die is mounted over the pressure opening such that the pressure sensing diaphragm is in fluid communication with the pressure opening; and
    an adhesive for mounting the back side of the pressure sensor die to the top side of the substrate, wherein the adhesive at least partially fills the one or more adhesion features formed in the back side of the pressure sensor die.

2. The pressure sensor assembly of claim 1, wherein the pressure sensor die includes one or more piezoresistors coupled to the pressure sensing diaphragm for sensing a pressure induced stress in the pressure sensing diaphragm.

3. The pressure sensor assembly of claim 1, wherein the one or more adhesion features include one or more recesses formed in the back side of the pressure sensor die.

4. The pressure sensor assembly of claim 3, wherein at least some of the one or more recesses are formed along a periphery of the back side of the pressure sensor die.

5. The pressure sensor assembly of claim 4, wherein the at least some of the one or more recesses formed along the periphery of the back side of the pressure sensor die are configured to extend through a side surface of the pressure sensor die.

6. The pressure sensor assembly of claim 5, wherein the adhesive is positioned to cover the at least some of the one or more recesses that extend through the side surface of the pressure sensor die.

7. The pressure sensor assembly of claim 3, wherein the one or more recesses are generally V-shaped recesses.

8. The pressure sensor assembly of claim 3, wherein the one or more recesses are generally rectangular-shaped recesses.

9. The pressure sensor assembly of claim 1, wherein the one or more adhesion features are configured to define a non-planar interface between the pressure sensor die and the adhesive.

10. The pressure sensor assembly of claim 1, wherein one or more corners of the back side are free from the one or more adhesion features.

11. A sensor assembly, comprising:
    a sensor die including a first side and a second opposing side, wherein the second side includes a plurality of spaced etched adhesion features;
    a substrate including a first side; and
    an adhesive, wherein the adhesive at least partially fills the plurality of spaced etched adhesion features and bonds the second side of the sensor die to the first side of the substrate.

12. The sensor assembly of claim 11, wherein at least some of the plurality of spaced etched adhesion features are formed along a peripheral edge of the second side of the sensor die.

13. The sensor assembly of claim 12, wherein the at least some of the plurality of spaced etched adhesion features extend through a side surface of the sensor die, wherein the side surface extends between the first and second surfaces of the sensor die.

14. The sensor assembly of claim 13, wherein the adhesive covers the at least some of the plurality of spaced etched adhesion features that extend through the side surface of the sensor die.

15. The sensor assembly of claim 11, wherein the one or more spaced etched adhesion features are generally V-shaped or rectangular-shaped.

16. The sensor assembly of claim 11, wherein one or more corners of the second side are free from the plurality of spaced etch adhesion features.

17. A method of fabricating a pressure sensor, the method comprising:

forming one or more piezoresistive elements on a first side of a pressure sensor die;

etching a second side of the pressure sensor die to form a pressure sensing diaphragm and one or more adhesion features, wherein the one or more adhesion feature are formed around a periphery of the second side of the pressure sensor die; and securing the second side of pressure sensor die to a substrate with an adhesive.

18. The method of claim 17, wherein securing the second side of pressure sensor die to the substrate with the adhesive includes:

providing a first layer of adhesive between the second side of the pressure sensor die and the package substrate; and applying a second layer of adhesive around a periphery of the pressure sensor die.

19. The method of claim 17, wherein the one or more adhesion features are configured to have sloping sidewalls.

20. The method of claim 17, wherein the second side of the pressure sensor die is etched using a wet etchant.

21. The method of claim 17, wherein the pressure sensing diaphragm and the one or more adhesion features are etched in the same processing step(s).

22. The method of claim 17, wherein the pressure sensing diaphragm and the one or more adhesion features are etched in separate processing steps.

* * * * *